US006348826B1

(12) United States Patent
Mooney et al.

(10) Patent No.: US 6,348,826 B1
(45) Date of Patent: Feb. 19, 2002

(54) DIGITAL VARIABLE-DELAY CIRCUIT HAVING VOLTAGE-MIXING INTERPOLATOR AND METHODS OF TESTING INPUT/OUTPUT BUFFERS USING SAME

(75) Inventors: Stephen R. Mooney; Matthew B. Haycock, both of Beaverton; Aaron K. Martin, Hillsboro; Jonathan N. Spitz, Portland, all of OR (US); Michael S. Sandhinti, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/605,624

(22) Filed: Jun. 28, 2000

(51) Int. Cl.[7] .............................................. H03H 11/16
(52) U.S. Cl. ...................................... 327/270; 327/231
(58) Field of Search ................................ 327/231, 256, 327/257, 356, 357, 359, 270, 261

(56) References Cited

U.S. PATENT DOCUMENTS

| | | | |
|---|---|---|---|
| 5,128,962 A | 7/1992 | Kerslake et al. ................ 345/7 |
| 5,148,381 A | 9/1992 | Sprague ...................... 364/723 |
| 5,164,960 A | 11/1992 | Winen et al. .................. 375/10 |
| 5,479,652 A | 12/1995 | Dreyer et al. .......... 395/183.06 |
| 5,489,864 A | 2/1996 | Ashuri ........................ 327/161 |
| 5,541,535 A | 7/1996 | Cao et al. ...................... 326/83 |
| 5,568,064 A | 10/1996 | Beers et al. ................... 326/31 |
| 5,604,450 A | 2/1997 | Borkar et al. .................. 326/82 |
| 5,641,931 A * | 6/1997 | Ogai et al. ..................... 84/661 |
| 5,666,302 A | 9/1997 | Tanaka et al. .............. 364/825 |
| 5,905,391 A | 5/1999 | Mooney ...................... 327/161 |
| 6,040,714 A | 3/2000 | Klein .......................... 326/86 |
| 6,073,151 A * | 6/2000 | Baker et al. ................. 708/290 |
| 6,121,808 A * | 9/2000 | Gaudet ........................ 327/231 |
| 6,150,862 A | 11/2000 | Vikinski ...................... 327/262 |
| 6,239,642 B1 | 5/2001 | Kim et al. ................... 327/276 |

FOREIGN PATENT DOCUMENTS

JP          05-129908          5/1993    ............ H03K/5/13

OTHER PUBLICATIONS

Haycock, J. et al., "A 2.5Gb/s Bidirectional Signaling Technology", Hot Interconnects Symposium V, pp. 1–8, (Aug. 1997).

* cited by examiner

*Primary Examiner*—Dinh T. Le
(74) *Attorney, Agent, or Firm*—Schwegman, Lundberg, Woesssner & Kluth, P.A.

(57) ABSTRACT

A variable-delay circuit on an integrated circuit is used to delay a periodic strobe signal. In normal operation, the strobe signal can be shifted 90 degrees to center it within a data bit cell. In test mode, it can also be shifted up to 270 degrees in N increments to measure the effective input latch setup and hold timings. The variable-delay circuit comprises a voltage-mixing interpolator circuit to produce phase delays in N increments. The variable-delay circuit can incorporate an existing delay locked loop. Also described are an electronic system, a data processing system, and various methods of performing on-chip testing and calibration.

25 Claims, 9 Drawing Sheets

US 6,348,826 B1

DIGITAL VARIABLE-DELAY CIRCUIT HAVING VOLTAGE-MIXING INTERPOLATOR AND METHODS OF TESTING INPUT/OUTPUT BUFFERS USING SAME

RELATED INVENTIONS

The present invention is related to the following inventions which are assigned to the same assignee as the present invention:

(1) Ser. No. 09/470,091, filed Dec. 21, 1999, entitled "Method and Apparatus to Structurally Detect Random Defects That Impact AC I/O Timings in an Input/Output Buffer";

(2) Ser. No. 09/474,874, filed Dec. 29, 1999, entitled "Method and Apparatus for Conducting Input/Output Loop Back Tests Using a Local Pattern Generator and Delay Elements";

(3) Ser. No. 09/605,479, filed Jun. 28, 2000, entitled "Apparatus and Methods for Testing Simultaneous Bi-Directional I/O Circuits"; and (4) Ser. No. 09/605,459, filed Jun. 28, 2000, entitled "Symmetric, Voltage-Controlled CMOS Delay Cell With Closed-Loop Replica Bias".

TECHNICAL FIELD OF THE INVENTION

The present invention relates generally to integrated circuits. More particularly, the present invention relates to a digital variable-delay circuit that incorporates a voltage-mixing interpolator circuit and to methods of using same to perform on-chip testing and of calibrating same.

BACKGROUND OF THE INVENTION

Integrated circuits (ICs) typically contain one or more functional logic blocks (FLB), such as a microprocessor, microcontroller, graphics processor, bus interface circuit, input/output (I/O) circuit, memory circuit, and the like. IC's are typically assembled into packages that are physically and electrically coupled to a substrate such as a printed circuit board (PCB) or a ceramic substrate to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the testing of ICs, where each new generation of IC's must provide increased performance while generally being smaller or more compact in size. IC's must generally be tested before they are incorporated into an electronic assembly in order to verify that each component of each FLB on the IC functions properly and to verify that the input/output (I/O) terminals of each IC operate correctly within specified timing parameters or timing margins.

In testing IC's, it is known to employ I/O loopback or switching state (AC) testing, as for example disclosed in Related Inventions Nos. 1 and 2 above. In I/O loopback testing, data is generated by a FLB within the IC and output through the output component of each I/O buffer. Subsequently, the data is received through the input component of each I/O buffer and conveyed to the FLB to verify that the correct data has been received. In this manner, the IC can verify that the input and output components of each I/O buffer are correctly operating.

It is known to use source synchronous data transfer on busses interconnecting FLB's within a single IC or within an electronic assembly comprising one or more IC's. In a source synchronous interface, a receiving I/O buffer captures data based upon a strobe clock that is provided by another FLB or IC device driving the data.

The use of digital delay circuits on IC's to assist in centering a strobe signal with respect to a data cell is known in the art, such as for example the delay locked loop disclosed in U.S. Pat. No. 5,905,391 assigned to the assignee of the present invention.

However, in order to test whether source synchronous interfaces are operating properly, it is desirable to be able to vary the delay of a digital delay circuit in order to shift a strobe signal across a full data bit cell time in order to measure the effective input latch setup and holding timing. It is also desirable to be able to calibrate a digital delay circuit to a known delay.

For the reasons stated above, and for other reasons stated below which will become apparent to those skilled in the art upon reading and understanding the present specification, there is a significant need in the art for a digital variable-delay circuit that can be used in loop-back testing of I/O buffers on IC's, and for methods of using such at digital variable-delay circuits for testing I/O buffers on IC's.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides improved methods of performing loopback testing of integrated circuits using an improved digital variable-delay circuit. Various embodiments are illustrated and described herein. In one embodiment, a programmable voltage-mixing interpolator circuit is used with a variable-delay circuit to generate phase delays from 90 degrees to 270 degrees in small increments. In another embodiment, a method of calibrating a programmable phase delay is provided. The present invention can be used either for outgoing data or incoming data.

Figure 1:
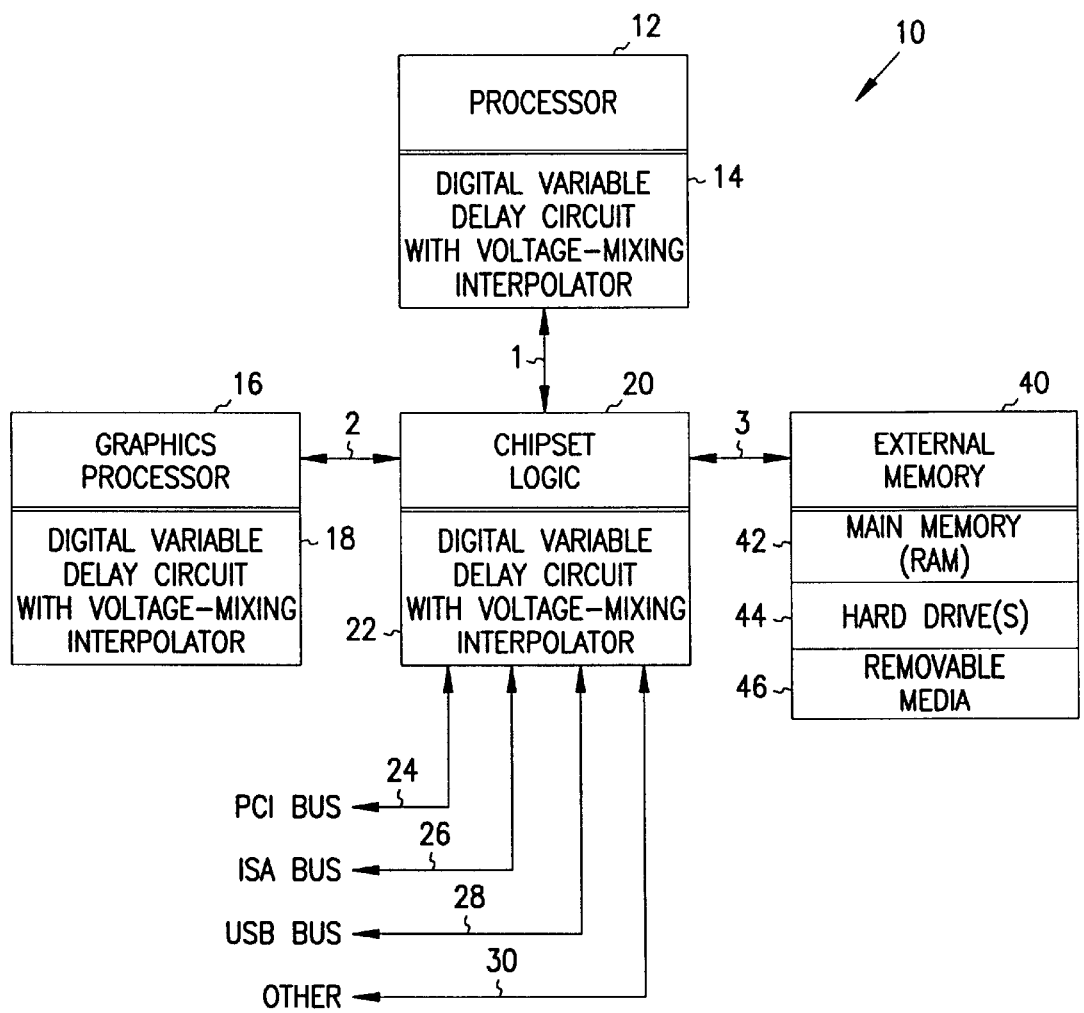
FIG. 1 illustrates a block diagram of an electronic system incorporating at least one digital variable-delay circuit with a voltage-mixing interpolator, in accordance with one embodiment of the invention.

FIG. 1 is a block diagram of an electronic system 10 incorporating at least one digital variable-delay circuit with a voltage-mixing interpolator, in accordance with one embodiment of the invention. In the example shown, electronic system 10 is a data processing system that comprises a plurality of components, including processor 12, a graphics processor 16, chipset logic 20, and external memory 40. These components are coupled to one or more busses 1–2.

As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Chipset logic 20 can be any one or more supporting circuits that couple processor 12 to external devices. For example, chipset logic 20 can include input/output (I/O) circuits, bus circuits, debug circuits, node control circuits, port switching circuits, memory controller circuits, and so forth.

In one embodiment, chipset logic 20 provides interfaces to various internal and external busses, such as a PCI bus 24, an ISA bus 26, and a USB bus 28. Chipset logic 20 can also provide an interface to any other desired bus, functional logic block (FLB), IC, or external device such as external memory 40, a network circuit, or the like via I/O line 30. It will be understood that external memory 40 could also be coupled to chipset logic 20 via one of bus I/O lines 24, 26, or 28.

External memory 40 can include main memory 42 in the form of random access memory (RAM), one or more hard drives(s) 44, and removable media 46 such as diskettes, compact disks (CD's), digital video disks (DVD's), and the like.

Processor 12, graphics processor 16, chipset logic 20, and RAM 42 can all be implemented on ICs. In the example shown in FIG. 1, chipset logic 20 comprises at least one IC that includes, in addition to other circuits, at least one digital variable-delay circuit with a voltage-mixing interpolator, in accordance with the present invention, as will be explained in further detail below. Chipset logic 20 can comprise a plurality of IC's in other embodiments, and normally each IC of the chipset logic 20 will include at least one digital variable-delay circuit of the type described herein.

Processor 12 is an integrated circuit comprising, in addition to other circuits, at least one digital variable-delay circuit with a voltage-mixing interpolator, in accordance with the present invention. Likewise, graphics processor 16 is an integrated circuit comprising, in addition to other circuits, at least one digital variable-delay circuit with a voltage-mixing interpolator, in accordance with the present invention. Other integrated circuits in the electronic system 10 can optionally comprise at least one digital variable-delay circuit with a voltage-mixing interpolator, if it is desired to achieve the advantages provided by the present invention.

The present invention, however, is not to be construed as limited to any particular architecture or combination of functional elements or ICs. Its use is extremely flexible, being readily adaptable to any electronic system 10 in which its advantages are desired to be achieved. Electronic system 10 is merely one example of an electronic system in which the present invention can be used. Other types of electronic systems with which the present invention can be used include communications equipment, such as Internet computers, cellular telephones, pagers, and two-way radios; entertainment systems; process control systems; aerospace equipment; automotive equipment; and similar electronic systems.

Each of the major elements depicted in the electronic system 10 of FIG. 1 can comprise one or more functional logic blocks (FLB's). The digital variable-delay circuit of the present invention is typically used on FLB's that contain I/O buffer circuits, but its use is not limited to such FLB's.

Figure 2:
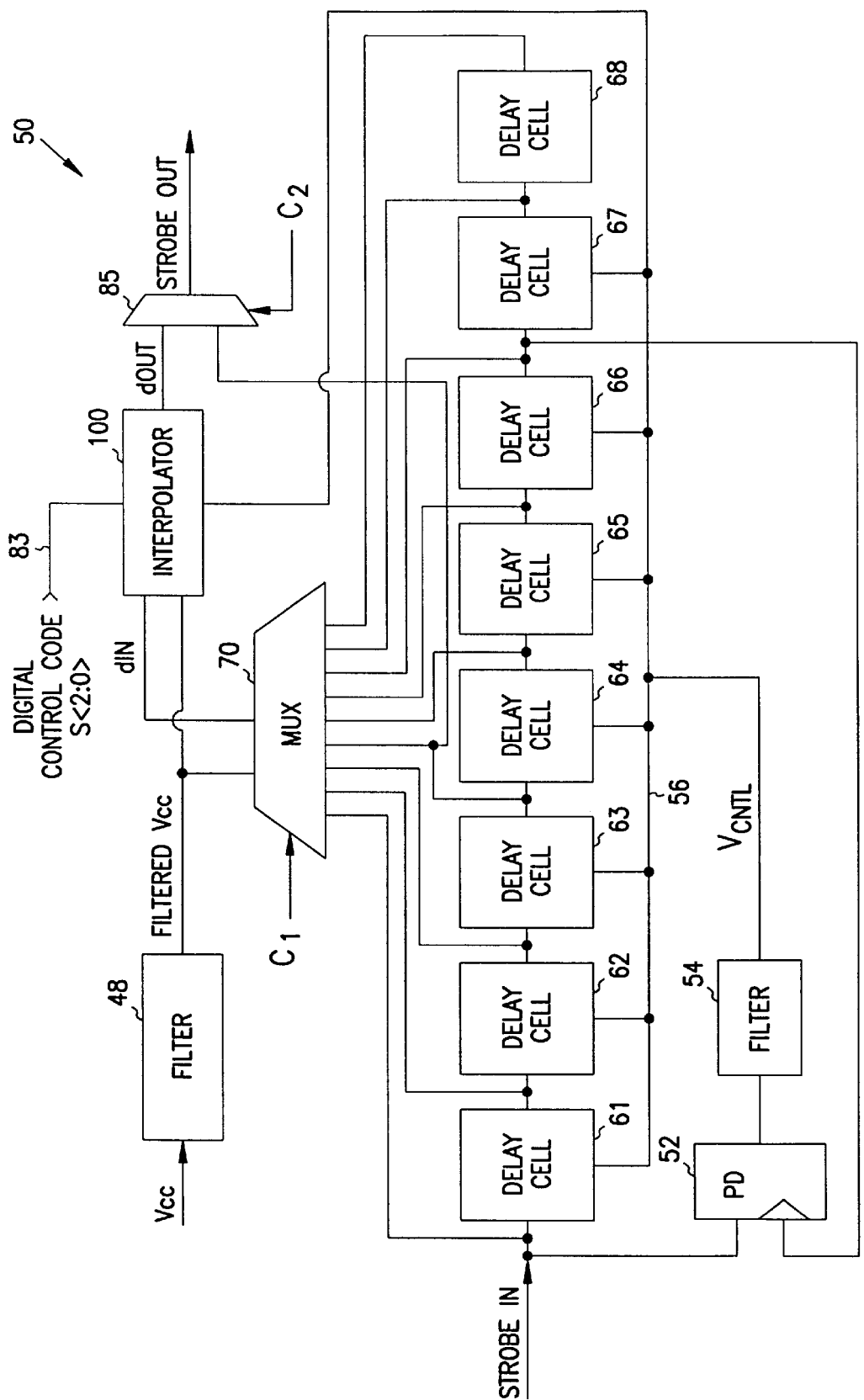
FIG. 2 illustrates a block diagram of a digital delay locked loop circuit with a voltage-mixing interpolator, in accordance with one embodiment of the invention.

FIG. 2 illustrates a block diagram of a digital delay locked loop (DLL) circuit 50 with a voltage-mixing interpolator 100, in accordance with one embodiment of the invention.

DLL circuit 50 includes digital delay line comprising a plurality of N delay cells, wherein N can be any desired number. In the embodiment shown, eight delay cells 61–68 are depicted. Delay cell 61 receives as an input a StrobeIn signal. StrobeIn is also applied to the input of phase detector (PD) 52 and as one input to multiplexer (MUX) 70. MUX 70 is controlled by control input $C_1$. In one embodiment, control input $C_1$ comprises a 4-bit control signal to select the appropriate output of the 9:1 MUX 70.

The output of delay cell 61 is applied to the input of the next delay cell 62 in the delay line. The output of delay cell 61 is also tapped as an input to MUX 70. Likewise, the outputs of delay cells 63–67 are fed into the succeeding delay cell and tapped as inputs to MUX 70. Finally, the output of delay cell 68 is fed into MUX 70.

The output of delay cell 66 is also fed back to the latching input of PD 52. The output of PD 52 is filtered by filter 54, which outputs a voltage control signal $V_{CNTL}$ that is applied to line 56. Filter 54 can be an R-C filter including a resistor and a p-channel metal oxide semiconductor (PMOS) transistor acting as a capacitor, such as is shown in U.S. Pat. No. 5,905,391 mentioned above. Line 56 is coupled to the control inputs of delay cells 61–67, as well as to a delay cell 102 (refer to FIG. 5) in interpolator 100. Voltage control signal $V_{CNTL}$ includes an nbias signal and a pbias signal. For further details concerning the structure and operation of the delay cells, refer to Related Invention No. 4.

The output $d_{in}$ of MUX 70 is input into voltage-mixing interpolator circuit 100. Interpolator circuit 100 also receives digital control codes (e.g. S<2:0> in Table 1) over bus 83. The output of interpolator circuit 100 is provided as an input to MUX 85. The output of delay cell 63 is also provided as one input to MUX 85. The output of MUX 85 is a StrobeOut signal. MUX 85 is controlled by control input $C_2$. In one embodiment, control input $C_2$ comprises a 1-bit control signal to select the desired output of 2:1 MUX 85.

Filter 48 provides a filtered Vcc supply to MUX 70 and to interpolator 100. In one embodiment, filter 48 is a single-pole R-C filter. The filtered Vcc supply reduces jitter on the $d_{in}$ output line of MUX 70.

Figure 3:
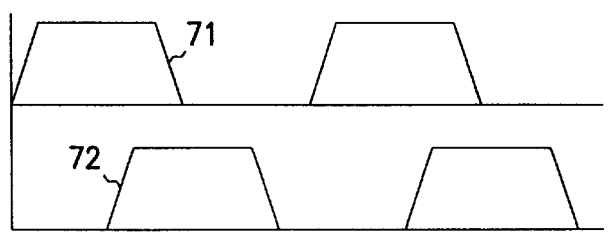
FIG. 3 illustrates a timing diagram of a 6-cell delay locked loop circuit operating in normal mode, in accordance with one embodiment of the invention.

FIG. 3 illustrates a timing diagram of a 6-cell delay locked loop circuit operating in normal mode, in accordance with one embodiment of the invention. When DLL 50 (FIG. 2) is operating in normal mode and DLL 50 is locked to a periodic signal, the electrical length of the delay line (comprising delay cells 61–66) is adjusted to be one phase of the incoming signal. In this condition, a tap from the center of the delay line (i.e. delay cell 63) provides a periodic signal delayed by 90 degrees. In FIG. 3, trace 71 represents the periodic signal (e.g. StrobeIn), and trace 72 represents the periodic signal delayed by 90 degrees (StrobeOut).

Figure 4:
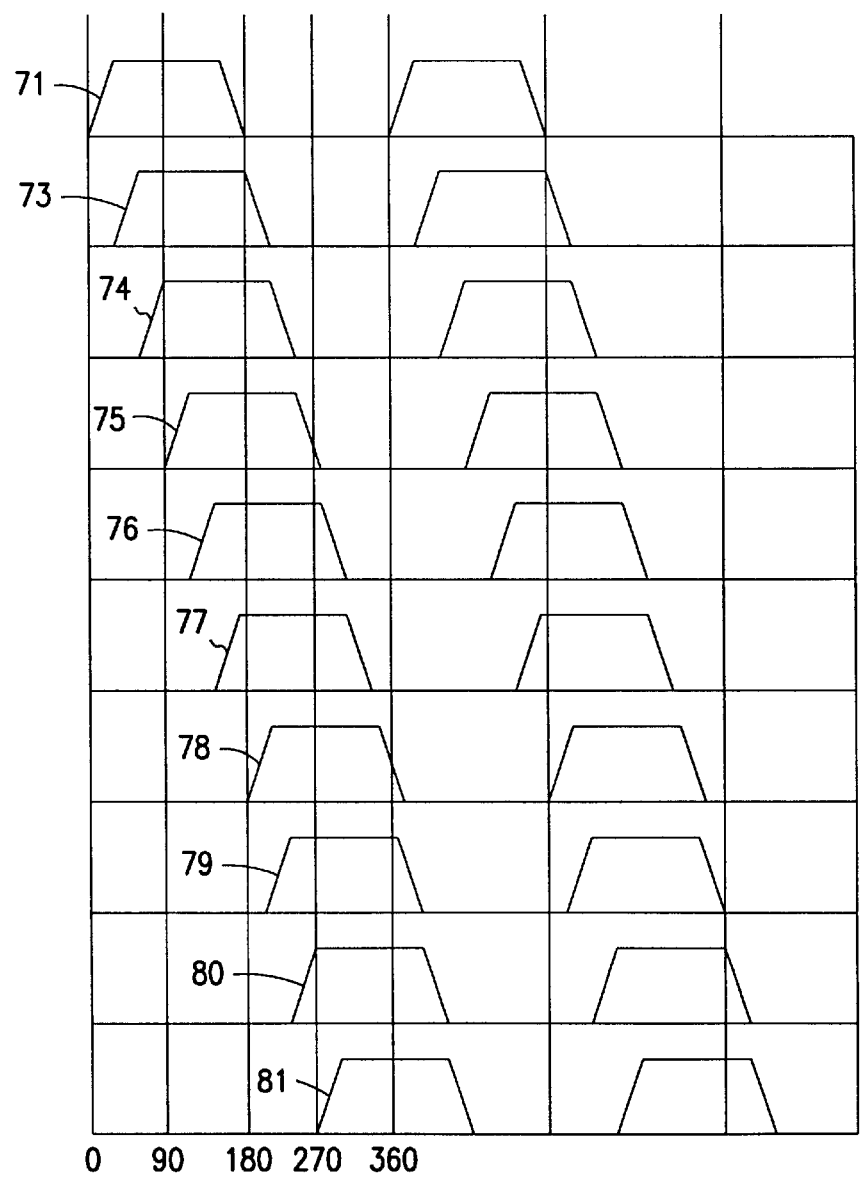
FIG. 4 illustrates a timing diagram for a data signal, a strobe signal, and a delayed strobe signal of an I/O circuit having a 6-cell delay locked loop circuit operating with 6 taps, in accordance with one embodiment of the invention.

FIG. 4 illustrates a timing diagram for a data signal, a strobe signal, and a delayed strobe signal of an I/O circuit having a 6-cell delay locked loop circuit operating with 6 taps, in accordance with one embodiment of the invention. Tapping the delay line of DLL 50 after each of N delay cells produces N intermediate signals, each having a fixed phase relationship with respect to the periodic signal StrobeIn, each being delayed from the intermediate signal of the previous tap by (180/N) degrees. For example, a delay line with 6 delay cells 61–66 produces 6 taps, each separated by 30 degrees.

In FIG. 4, trace 71 is the periodic signal (StrobeIn) as in FIG. 3. Trace 73 represents the periodic signal delayed by 30 degrees. Traces 74–78 represent the periodic signal delayed by 60, 90, 120, 150, and 180 degrees, respectively.

Delay cells can be added at the end of the 6-cell delay line in order to shift the StrobeIn signal beyond 180 degrees in 30 degree increments. For example, with reference to FIG. 2, delay cell 67 provides an additional shift of the StrobeIn signal to 180+30=210 degrees, represented by trace 79 in FIG. 4. Likewise, delay cell 68 shifts the StrobeIn signal by 180+60=240 degrees, represented by trace 80 in FIG. 4. The addition of another delay cell (not shown) to the delay line shown in FIG. 3 would accordingly shift the StrobeIn signal by 180+90=270 degrees, represented by trace 81 in FIG. 4. It will be understood that the StrobeIn signal can be shifted by any desired amount, and that the shift is not limited to 270 degrees.

MUX 70 is controlled in known manner to select one of the N taps corresponding to the desired phase offset. For example, if it is desired to offset the phase of the StrobeIn signal by 90 degrees, the tap from delay cell 63 would be selected.

Figure 5:
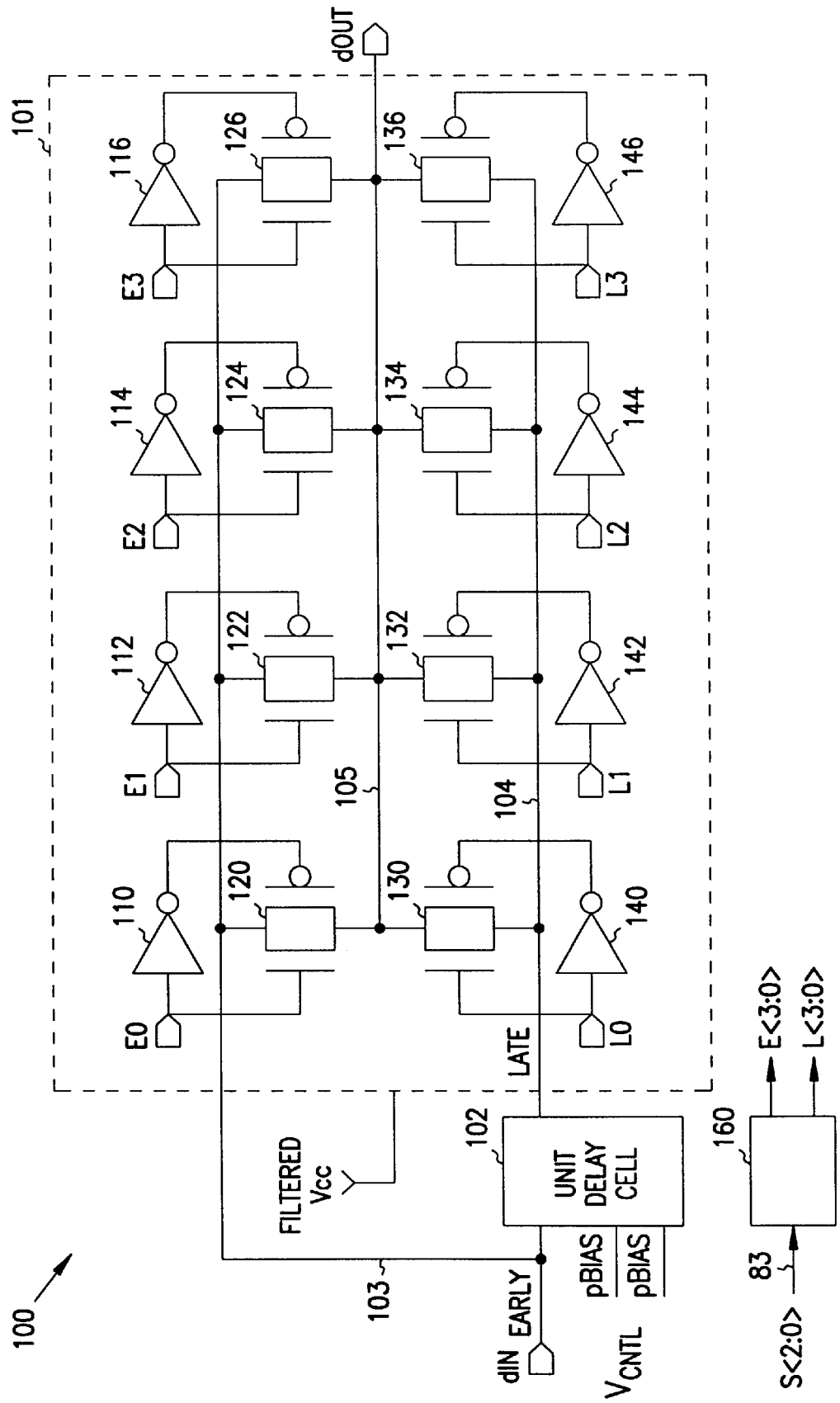
FIG. 5 illustrates a block diagram of a voltage-mixing interpolator, in accordance with an embodiment of the invention.

FIG. 5 illustrates a block diagram of a voltage-mixing interpolator 100, in accordance with an embodiment of the invention. Interpolator 100 provides a controllable phase offset in fine-scale increments. Interpolator 100 subdivides the (180/N) degree delay of one delay cell into M smaller time intervals. FIG. 5 illustrates an interpolator 100 that generates M=8 time intervals.

Interpolator 100 comprises a unit delay cell 102 that can be of the same type as the delay cells 61–68 of FIG. 2; alternatively, delay cell 102 can be different than delay cells 61–68. Delay cell 102 generates an intermediate output signal on line 104 that has a fixed phase relationship with respect to a periodic signal received at input node din.

Interpolator 100 operates by "mixing" the input and the delayed output of delay cell 102. The mixing is performed by a suitable logic circuit such as logic circuit 101, which, in one embodiment, is implemented through two series of transmission gates. One series of transmission gates 120, 122, 124, and 126 have their input nodes coupled to a line 103. Line 103 is also coupled to a delay-in ($d_{in}$) input node to receive a periodic signal or a delayed periodic signal, such as one emanating from one of the taps of the delay line shown in FIG. 2. The output nodes of transmission gates 120, 122, 124, and 126 are coupled to line 105, which is coupled to a delay-out ($d_{out}$) output node or terminal.

A second series of transmission gates 130, 132, 134, and 136 have their input nodes coupled to a line 104, that is also coupled to the output of delay cell 102. The output nodes of transmission gates 130, 132, 134, and 136 are coupled to line 105.

Each of transmission gates 120, 122, 124, and 126 has an N-type control gate or control node coupled to a respective one of nodes E0, E1, E2, or E3, and each has a P-type control gate or control node coupled to the output of a respective inverter 110, 112, 114, or 116, the inputs of which inverters are coupled to nodes E0, E1, E2, or E3, respectively.

Similarly, each of transmission gates 130, 132, 134, and 136 has an N-type control gate coupled to a respective one of nodes L0, L1, L2, or L3, and each has a P-type control gate coupled to the output of a respective inverter 140, 142, 144, or 146, the inputs of which inverters are coupled to nodes L0, L1, L2, or L3, respectively.

A transmission gate generates an output only if its input is high, and its N-type control gate is high and/or its P-type control gate is low. Enabling or disabling the transmission gates varies the amount of phase delay in the output signal $d_{out}$ of interpolator 100. The output phase delay characteristics of interpolator 100 are monotonic and linear.

In one embodiment, for example, in which interpolator 100 produces M=8 time intervals, a 3-input decoder 160 receives a 3-bit control code over bus 83 and generates the E<3:0> and L<3:0> transmission gate enable signals. This is explained with reference to Table 1 below.

Decoder circuit 160 receives inputs S0, S1, and S2, and it generates one set of outputs E0, E1, E2, and E3 and a second set of outputs L0, L1, L2, and L3 in accordance with Table 1.

| S<2:0> | E<3:0> | L<3:0> |
|---|---|---|
| 000 | 1110 | 0000 |
| 001 | 1101 | 1000 |
| 010 | 1100 | 1001 |
| 011 | 1011 | 1010 |

| S<2:0> $S_2,S_1,S_0$ | E<3:0> $L_3,E_2,E_1,E_0$ | L<3:0> $L_3,L_2,L_1,L_0$ |
|---|---|---|
| 000 | 1101 | 0000 |
| 001 | 1011 | 0001 |
| 010 | 1001 | 0011 |
| 011 | 0111 | 0101 |

| 100 | 0101 | 0111 |
| 101 | 0011 | 1001 |
| 110 | 0001 | 1011 |
| 111 | 0000 | 1101 |

The delayed periodic signal $d_{out}$ at the output junction of interpolator 100 is delayed [180/(N*M)] degrees. Digital control of the N-input multiplexer 70 (FIG. 2) and the interpolator 100 (FIG. 5) provides N*M discrete steps by which the periodic signal may be delayed.

A filtered Vcc supply voltage, which is provided by filter 48 (FIG. 2), reduces jitter on the $d_{out}$ output line of interpolator 100 by reducing power supply noise on the control gates of the transmission gates within logic circuit 101.

Figure 6:
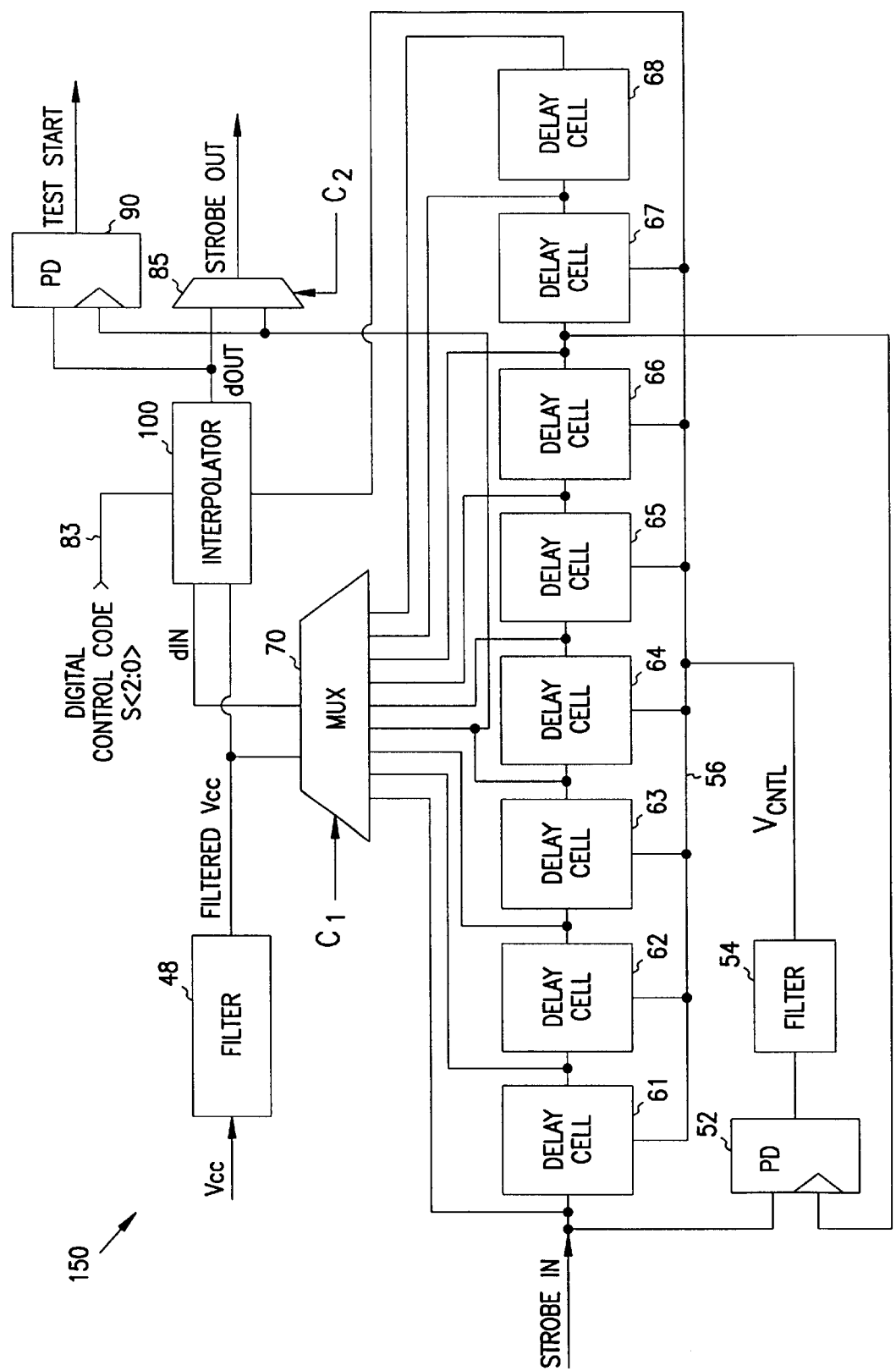
FIG. 6 illustrates a block diagram of an alternate embodiment of a digital delay locked loop circuit with a voltage-mixing interpolator, in accordance with an alternate embodiment of the invention.

FIG. 6 illustrates a block diagram of an alternate embodiment of a digital delay locked loop circuit 150 with a voltage-mixing interpolator 100, in accordance with an alternate embodiment of the invention. DLL circuit 150 can be substantially identical in all respects to DLL circuit 50 (FIG. 2), but it additionally comprises a phase detector (PD) 90. PD 90 has one input coupled to the output of interpolator 100, and it has a latching input coupled to the output of delay cell 63.

DLL circuit 150 can be used to calibrate its digital delay settings to a known delay. When a functional logic block (FLB) containing a DLL circuit such as DLL circuit 50 or DLL circuit 150 is operated in AC (switching state) loopback test mode, a StrobeIn signal can be digitally shifted across the timing window to measure the setup and hold margins. However, a reference point or way of calibrating the DLL to a known delay may be desired.

To do this, the output of the voltage-mixing interpolator 100 is compared with the 90 degree tap of the delay line emanating from delay cell 63. This calibrates, within [180/(N*M)] degrees, which digital control code (e.g. combinations of S<2:0> and $C_1$<3:0>) corresponds to the known 90 degree delay. It will be apparent that other than the 90 degree tap of the delay line could be compared to obtain which digital control code corresponds to that particular phase delay.

When the output of interpolator 100 matches that of the known value of phase offset, phase detector 90 generates a Test Start output signal that can be used to trigger a loopback test mode of the I/C.

Figure 7:
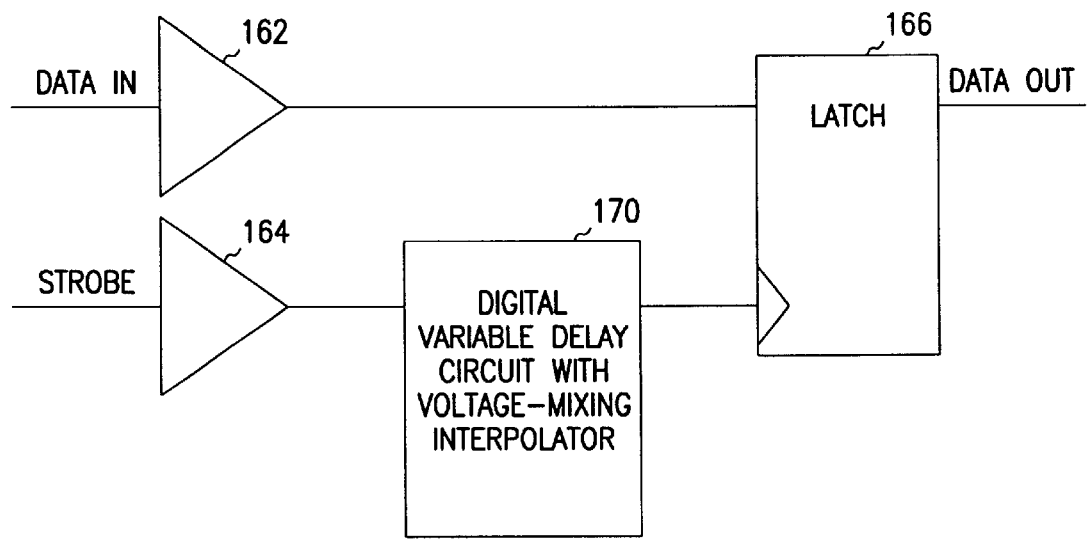
FIG. 7 illustrates the use of a digital variable-delay circuit with a voltage-mixing interpolator to center a strobe within a data cell bit, in accordance with one embodiment of the invention.

FIG. 7 illustrates the use of a digital variable-delay circuit with a voltage-mixing interpolator 170 to center a strobe within a data cell bit, in accordance with one embodiment of the invention. Digital variable-delay circuit 170 can be like digital delay locked loop circuit 50 in one embodiment. In other embodiments, a voltage-mixing interpolator as disclosed herein can be combined with other types of delay circuits.

A DataIn signal is input to driver 162, whose output is coupled to an input of latch 166. A Strobe signal is input to driver 164, whose output is coupled to digital variable-delay circuit 170. The output of digital variable-delay circuit 170 is coupled to a latching input of latch 166. The output of latch 166 is a DataOut signal.

Digital variable-delay circuit 170 is used to delay the Strobe signal to position the edges of the Strobe signal with respect to the data cells of the DataIn signal, as is discussed in greater detail in U.S. Pat. No. 5,905,391 mentioned above.

In another embodiment, digital variable-delay circuit 170 can be used to delay a strobe signal to position the edges of the strobe signal with respect to the data cells of a data-out signal.

Figure 8:
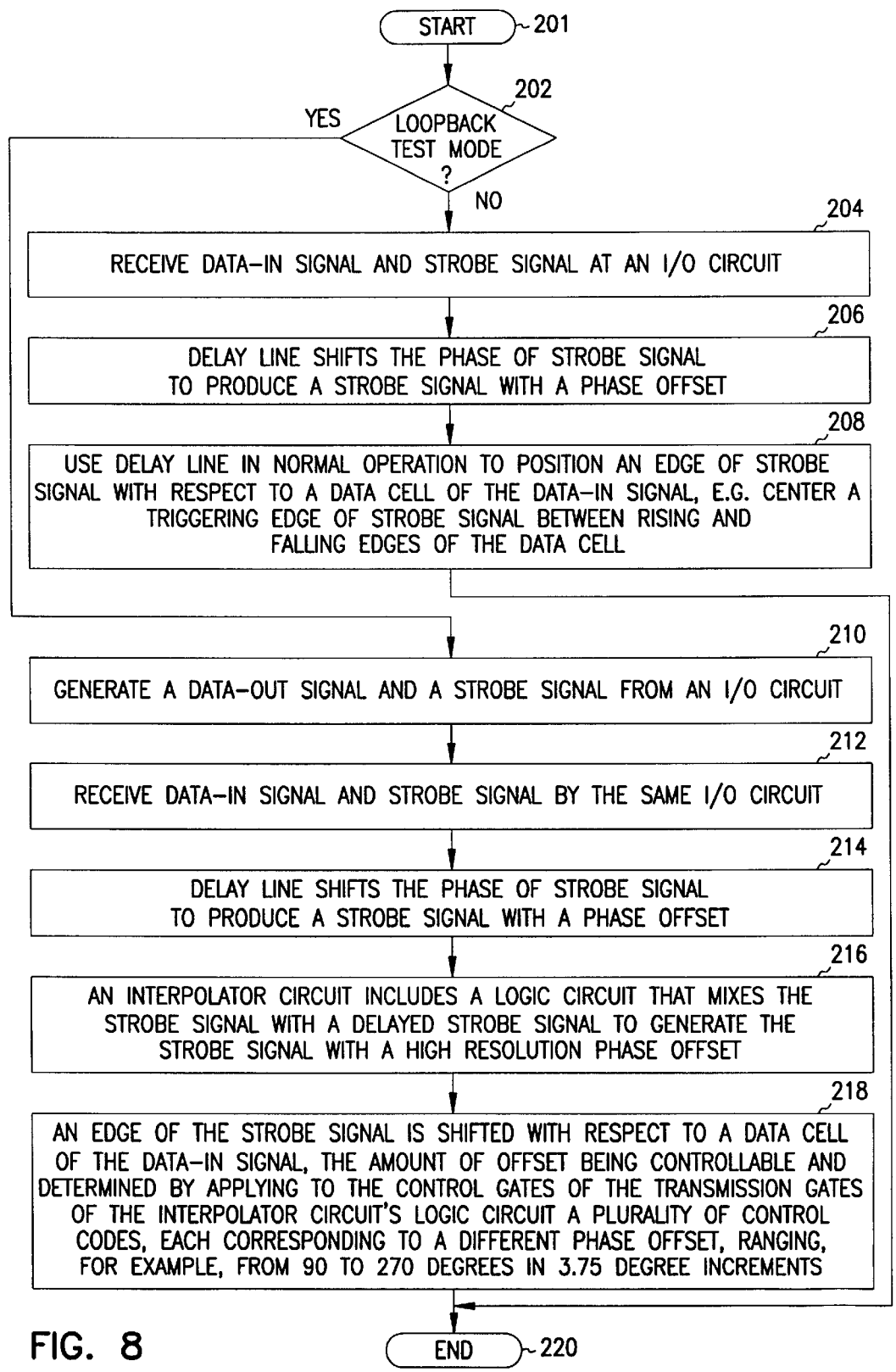
FIG. 8 illustrates a flow diagram of a method of generating programmable phase delays on an integrated circuit, including use in normal operation and use in loopback test mode, in accordance with one embodiment of the invention.

FIG. 8 illustrates a flow diagram of a method of generating programmable phase delays on an integrated circuit, including use in normal operation and use in loopback test mode, in accordance with one embodiment of the invention. The method begins at 201.

In 202, a determination is made whether the IC is to operate in normal mode or loopback test mode. If loopback testing is selected, the method goes to 210; otherwise, it goes to 204.

In 204, an I/O circuit (also called an I/O buffer) of the IC receives a data-in signal and a strobe signal. It will be understood that in one embodiment, the data-in signal and strobe signal will be received by separate I/O pins of the IC, whereas in another embodiment, both data and strobe information is received by the same I/O pin. The present invention is readily adaptable to both types of source-synchronous signaling.

In 206, a delay line associated with the I/O circuit shifts the phase of the strobe signal to produce a strobe signal with a phase offset. As shown in FIG. 2, the delay line comprises a plurality of N delay cells, the output taps of which are fed into a selector element such as multiplexer (MUX) 70, which operates in a well known manner to select one of its inputs as an output. MUX 70 can be operated to select a "coarse resolution" phase offset of 30, 60, 90, 120, 150, 180, 210, 240, or 270 degrees for the particular embodiment illustrated in FIG. 2, as described above regarding the timing s diagram of FIG. 4.

In 208, in normal operation the delay line is used to position an edge of the strobe signal with respect to a data cell of the data-in signal. Ideally, a triggering edge of the strobe signal is positioned in the center of the data cell, i.e. between the rising edge and falling edge of the data cell.

In 210, when the IC is operating in loopback test mode, the I/O circuit generates a data-out signal and a strobe signal, and in 212 the same I/O circuit receives the data-out signal and the strobe signal as a data-in signal and strobe signal, respectively.

In 214, as in 206, the delay line shifts the phase of the strobe signal to produce a strobe signal with a phase offset. This phase offset can be a "coarse resolution" phase offset, as described earlier regarding box 206.

In 216, an on-chip interpolator circuit (100, FIG. 5) includes a logic circuit (101, FIG. 5) that mixes the strobe signal with a delayed strobe signal to generate the strobe signal with a "high resolution" phase offset. In one embodiment, the logic circuit is implemented with two series of transmission gates.

In 218, an edge of the strobe signal is shifted with respect to a data cell of the data-in signal. The amount of the offset is controllable and is determined by applying a plurality of control codes to control gates of the transmission gates. Each combination of control codes corresponds to a different high-resolution phase offset. For example, in the embodiment illustrated in FIG. 2, in which each "coarse" phase offset is subdivided into M=8 time intervals, each different control code combination corresponds to a 30/8=3.75 degree phase shift. The method ends at 220.

Figure 9:
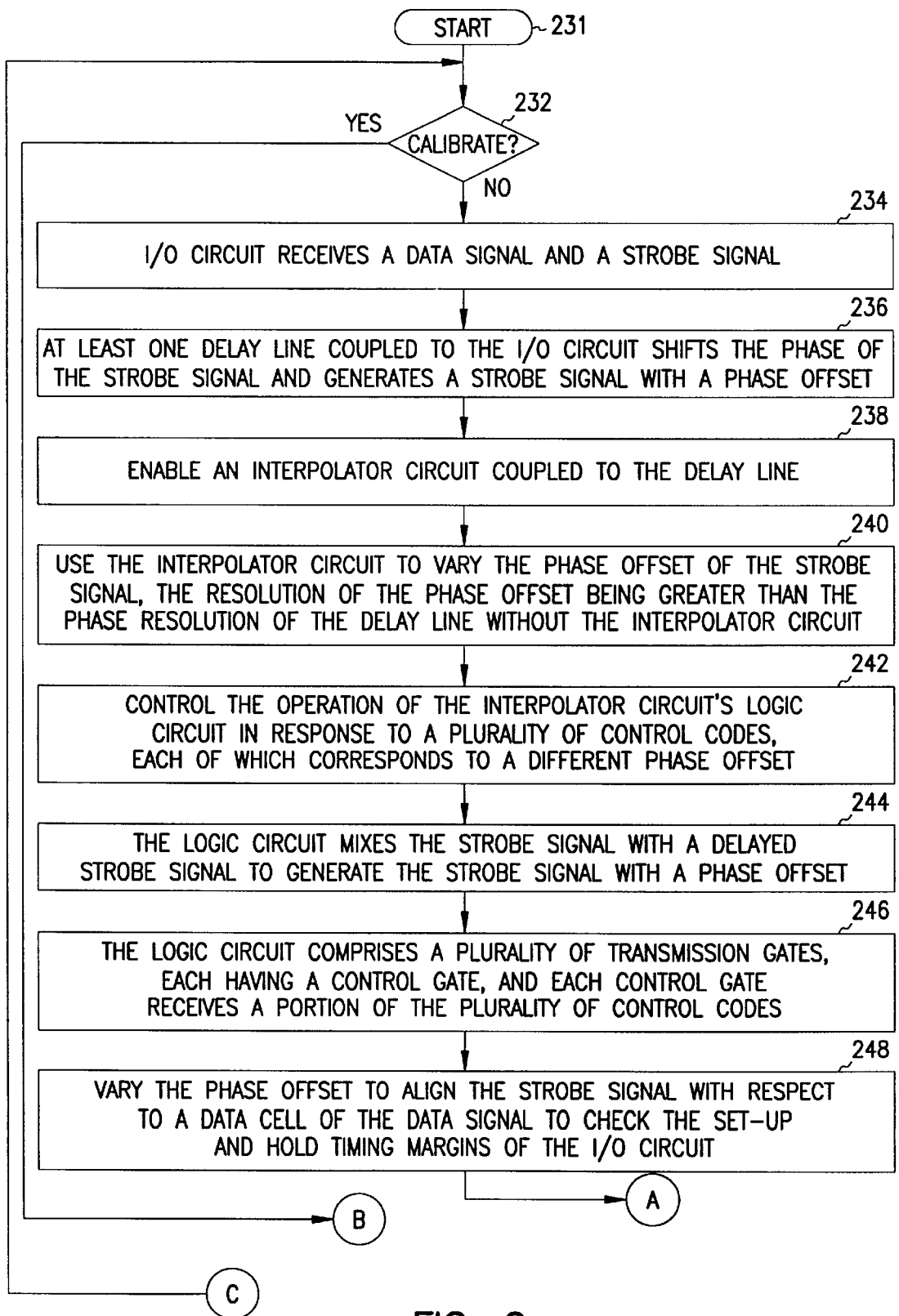
FIG. 9 illustrates a flow diagram of a method of generating programmable phase delays on an integrated circuit, including calibrating a programmable phase delay circuit, in accordance with one embodiment of the invention.
Figure 9:
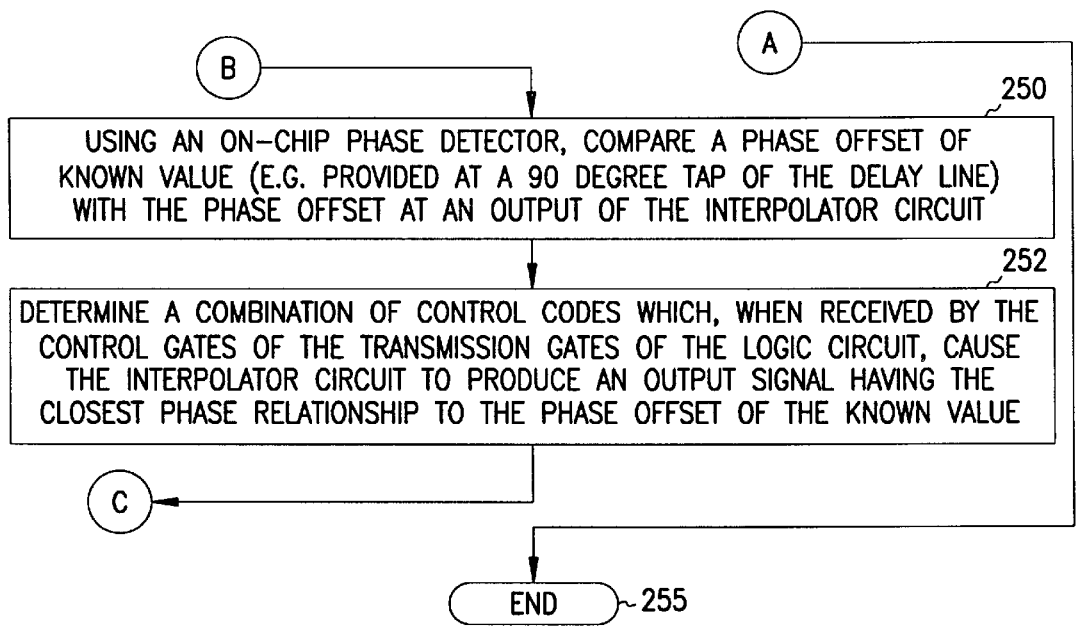

FIG. 9 illustrates a flow diagram of a method of generating programmable phase delays on an integrated circuit, including calibrating a programmable phase delay circuit, in accordance with one embodiment of the invention. The method begins at 231.

In 232, a determination is made whether to calibrate a programmable phase delay circuit on the IC, such as interpolator circuit 100 (FIG. 5). If calibration is selected, the method goes to 250; otherwise, it goes to 234.

In 234, an I/O circuit of the IC receives a data signal and a strobe signal. It will be understood that the received data signal can be either an incoming data-in signal received at an I/O pin or I/O terminal, or it can be a data signal from a functional logic block within the IC that is being sent to an I/O pin or I/O terminal.

In 236, at least one delay line coupled to the I/O circuit shifts the phase of the strobe signal and generates a strobe signal with a phase offset. This can be done in the manner described above regarding 206 (FIG. 8) to generate one of a plurality of coarse phase offsets.

In 238, one of the features of the present invention is to employ and enable an interpolator circuit coupled to the delay line, to further sub-divide the coarse phase offset into a plurality of programmable fine phase offsets, one of which can be selected by a corresponding combination of control codes. In 240, the interpolator circuit is used to vary the phase offset of the strobe signal. The resolution of the phase offset provided by the interpolator is greater than that of the delay line without the interpolator circuit or with the interpolator circuit inoperative.

In 242, the interpolator circuit's logic circuit (e.g. logic circuit 101, FIG. 5) is controlled in response to a plurality of control codes, each combination of which corresponds to a different fine-level phase offset that can be provided by the interpolator circuit.

In 244, the logic circuit mixes the strobe signal with a delayed strobe signal to generate the strobe signal with a fine-level phase offset. In one embodiment, as indicated in 246, the logic circuit comprises a plurality of transmission gates, each having a control gate. Each control gate receives a portion of the plurality of control codes. This was previously shown and discussed regarding FIG. 5 and Table 1.

In 248, in a loopback test mode of operation, the phase offset can be varied to align the strobe signal with respect to a data cell of the data signal to check the set-up and hold timing margins of the I/O circuit.

In 250, when the programmable phase delay circuit is to be calibrated, an on-chip phase detector compares a phase offset of a known value (e.g. the phase offset provided at a 90-degree tap of the delay line) with the phase offset at an output of the interpolator circuit.

In 252, by determining the interpolator output having the closest phase relationship to the phase offset of the known value, the combination of control codes can be determined that produces this phase offset. The control codes are received by the control gates of the transmission gates of the logic circuit, in one embodiment. For example, if control code S<2:0>=000 controls the output of interpolator circuit 100 (FIG. 6) to generate a 90-degree phase offset, then control code 000 will be used whenever a 90-degree phase offset is desired, such as in the loopback test mode. It is of course possible that a different control code may be the one that is determined to provide the optimum fine-scale phase offset to cause the output of interpolator circuit 100 to generate a 90-degree phase offset. The method ends at 255.

The operations described above with respect to the methods illustrated in FIGS. 8 and 9 can be performed in a different order from those described herein.

CONCLUSION

The present invention provides for a variable-delay circuit that offers fine resolution delay settings through the use of a voltage-mixing interpolator circuit. The variable-delay circuit can be used, for example in an I/O circuit of an IC, in either of two modes. In a normal mode, the variable-delay circuit can be used to center a strobe with respect to a data cell, and in a loopback test mode it can be used to shift the strobe across a fall data cell time window to measure the effective input latch setup and hold timing. The variable-delay circuit can be used for these purposes either with respect to incoming data or outgoing data. The invention thus implements source-synchronous bus interfaces found in high performance computer-based systems.

The variable-delay circuit can be built around and incorporate an existing on-chip delay line, so that circuitry that has been compensated for process, voltage, and temperature variations can be used for both normal node and loopback test mode. This significantly reduces the jitter in the delayed signal in comparison with using uncompensated circuitry.

Also, a method of calibrating a programmable phase delay circuit is described, in which the programmable phase delay is compared with a known phase delay that is generated on-chip. This method is more accurate than a known method of varying the core clock frequency to vary the data cell time, because as the core clock frequency is varied so are the resultant noise characteristics. In the method described in the present invention, it is not necessary to vary the core clock frequency.

An electronic system comprising IC's that incorporate the present invention can perform more accurate testing of bus interface timing functions and is therefore more commercially attractive. The present invention also provides excellent range, resolution, and jitter characteristics to perform on-chip timing measurements in I/O circuits. This eliminates the need to purchase and deploy expensive high-speed test equipment in high volume manufacturing environments, resulting in more commercially competitive electronic systems.

As shown herein, the present invention can be implemented in a number of different embodiments, including an interpolator circuit, an integrated circuit, an electronic system, a method for providing programmable phase delays, a method for performing loopback testing of an IC, and a method for calibrating a programmable phase delay. Other embodiments will be readily apparent to those of ordinary skill in the art.

Many variations of the various circuitry appearing in the drawings will be apparent to those skilled in the art having the benefit of this disclosure. For example, the various circuits disclosed herein may be replaced with other circuits of different construction and of different quantity that, taken as a whole, perform the same or similar function. The general functions of the invention may also be performed by significantly different circuitry.

Where a single conductor is illustrated or described, it may be replaced by parallel conductors. Where parallel conductors are illustrated or described, they may be replaced by a single conductor.

It is not required that delay cells 61–68 be identical to one another. Although the delay line of FIG. 2 has 8 delay cells, a greater or lesser number can be used. Likewise, although 8 transmission gates are shown in FIG. 5, a greater or lesser number can be used to provide greater or less phase angle resolution, depending upon the requirements of the particular application.

The various structures of the present invention may be implemented according to any of various elements and methods known to those skilled in the art. There may be intermediate structure (such as an inverter or buffer) or signals that are between two illustrated structures. Some conductors may not be continuous as illustrated but rather they are broken up by intermediate structure. The borders of boxes in the figures are for illustrative purposes only. An actual device would not have to include such defined boundaries. The relative size and/or layout of the illustrate elements is not to suggest actual relative sizes or layout.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An interpolator circuit for providing a controllable phase offset comprising:
   an output terminal at which the controllable phase offset is provided;
   a delay circuit comprising an input node to receive a periodic signal, and an output node to generate an output signal having a fixed phase relationship with respect to the periodic signal; and
   a logic circuit to mix the periodic signal with the output signal to produce the controllable phase offset, wherein the logic circuit comprises:
      a first plurality of transmission gates, each having a first node coupled to the input node, a control node, and a second node coupled to the output terminal; and
      a second plurality of transmission gates, each having a first node coupled to the output node, a control node, and a second node coupled to the output terminal.

2. The interpolator circuit of claim 1, wherein the control nodes of the first and second plurality of transmission gates are configured to receive first and second control codes, respectively.

3. An interpolator circuit for providing a controllable phase offset comprising:
   an output terminal at which the controllable phase offset is provided;
   a delay circuit comprising an input node to receive a periodic signal, and an output node to generate an output signal having a fixed phase relationship with respect to the periodic signal;
   a first plurality of transmission gates, each having a first node coupled to the input node, a control node, and a second node coupled to the output terminal; and
   a second plurality of transmission gates, each having a first node coupled to the output node, a control node, and a second node coupled to the output terminal.

4. The interpolator circuit of claim 3, wherein the control nodes of the first and second plurality of transmission gates are configured to receive first and second control codes, respectively.

5. The interpolator circuit of claim 4, wherein relative contributions of the periodic signal and of the output signal to the controllable phase offset can be varied depending upon the first and second control codes.

6. A variable-delay circuit comprising:
   an input terminal to receive a periodic signal;
   an output terminal to provide an output signal having a fixed phase relationship with respect to the periodic signal;
   a delay line coupled to the input terminal to receive the periodic signal, and having a tap to provide a first intermediate signal having a fixed phase relationship with respect to the periodic signal; and
   an interpolator circuit coupled to the tap to provide a controllable phase offset and comprising:
      an output junction coupled to the output terminal;
      a delay circuit, having an input node to receive the first intermediate signal, and having an output node to generate a second intermediate signal having a fixed phase relationship with respect to the first intermediate signal; and
      a logic circuit to mix the first intermediate signal with the second intermediate signal to produce the controllable phase offset, wherein the logic circuit comprises:
         a first plurality of transmission gates, each having a first node coupled to the input node, a control node, and a second node coupled to the output junction; and
         a second plurality of transmission gates, each having a first node coupled to the output node, a control node, and a second node coupled to the output junction.

7. The variable-delay circuit of claim 6, wherein the control nodes of the first and second plurality of transmission gates are configured to receive first and second control codes, respectively.

8. An integrated circuit having at least one variable-delay circuit comprising
   a first terminal to receive a periodic signal;
   a second terminal to provide an output signal having a fixed phase relationship with respect to the periodic signal;
   a delay line coupled to the first terminal to receive the periodic signal, and having a tap to provide a first intermediate signal having a fixed phase relationship with respect to the periodic signal; and
   an interpolator circuit coupled to the tap to provide a controllable phase offset and comprising:
      an output junction coupled to the second terminal;
      a delay circuit, having an input node to receive the first intermediate signal, and having an output node to generate a second intermediate signal having a fixed phase relationship with respect to the first intermediate signal; and
      a logic circuit to mix the first intermediate signal with the second intermediate signal to produce the controllable phase offset, wherein the logic circuit comprises:
         a first plurality of transmission gates, each having a first node coupled to the input node, a control node, and a second node coupled to the output junction; and
         a second plurality of transmission gates, each having a first node coupled to the output node, a control node, and a second node coupled to the output junction.

9. The integrated circuit of claim 8, wherein the control nodes of the first and second plurality of transmission gates are configures to receive first and second control codes, respectively.

10. The integrated circuit of claim 9 wherein the delay line generates a phase delay of known value at the tap of the delay line, the integrated circuit further comprising:
   a phase detector responsive to the phase delay of known value and to the output signal for determining a combination of the first and second control codes which, when received by the first and second plurality of transmission gates, respectively, cause the interpolator circuit to produce an output signal having the closest phase relationship to the phase delay of known value.

11. An electronic system having at least one variable-delay circuit comprising:

a first terminal to receive a periodic signal;

a second terminal to provide an output signal having a fixed phase relationship with respect to the periodic signal;

a delay line coupled to the first terminal to receive the periodic signal, and having a tap to provide a first intermediate signal having a fixed phase relationship with respect to the periodic signal; and an interpolator circuit coupled to the tap to provide a controllable phase offset and comprising:

an output junction coupled to the second terminal;

a delay circuit, having an input node to receive the first intermediate signal, and having an output node to generate a second intermediate signal having a fixed phase relationship with respect to the first intermediate signal; and a logic circuit to mix the first intermediate signal with the second intermediate signal to produce the controllable phase offset, wherein the logic circuit comprises:

a first plurality of transmission gates, each having a first node coupled to the input node, a control node, and a second node coupled to the output junction; and a second plurality of transmission gates, each having a first node coupled to the output node, a control node, and a second node coupled to the output junction.

12. The electronic system of claim 11, wherein the control nodes of the first and second plurality of transmission gates are configured to receive first and second control codes, respectively.

13. A data processing system comprising:

a plurality of components;

a bus coupling the components; and wherein at least one component includes at least one variable-delay circuit comprising:

a first terminal to receive a periodic signal;

a second terminal to provide an output signal having a fixed phase relationship with respect to the periodic signal;

a delay line coupled to the first terminal to receive the periodic signal, and having a tap to provide a first intermediate signal having a fixed phase relationship with respect to the periodic signal; and an interpolator circuit coupled to the tap to provide a controllable phase offset and comprising:

an output junction coupled to the second terminal;

a delay circuit, having an input node to receive the first intermediate signal, and having an output node to generate a second intermediate signal having a fixed phase relationship with respect to the first intermediate signal; and a logic circuit to mix the first intermediate signal with the second intermediate signal to produce the controllable phase offset, wherein the components are from the group consisting of a processor, chipset logic, and an external memory.

14. A data processing system comprising:

a plurality of components;

a bus coupling the components; and wherein at least one component includes at least one variable-delay circuit comprising:

a first terminal to receive a periodic signal;

a second terminal to provide an output signal having a fixed phase relationship with respect to the periodic signal;

a delay line coupled to the first terminal to receive the periodic signal, and having a tap to provide a first intermediate signal having a fixed phase relationship with respect to the periodic signal; and an interpolator circuit coupled to the tap to provide a controllable phase offset and comprising:

an output junction coupled to the second terminal;

a delay circuit, having an input node to receive the first intermediate signal, and having an output node to generate a second intermediate signal having a fixed phase relationship with respect to the first intermediate signal; and a logic circuit to mix the first intermediate signal with the second intermediate signal to produce the controllable phase offset, wherein the logic circuit comprises:

a first plurality of transmission gates, each having a first node coupled to the input node, a control node, and a second node coupled to the output junction;

a second plurality of transmission gates, each having a first node coupled to the output node, a control node, and a second node coupled to the output junction; and wherein the control nodes of the first and second plurality of transmission gates are configured to receive first and second control codes, respectively.

15. A method for performing loopback testing of an integrated circuit having at least one input/output circuit to generate and to receive a data signal and a strobe signal, the integrated circuit further having at least one delay line, the delay line being coupled to the at least one input/output circuit, the method comprising:

using the delay line in normal operation to position an edge of the strobe signal with respect to a data cell of the data signal; and using the same delay line in loopback testing to shift the edge of the strobe signal with respect to the data cell of the data signal.

16. The method of claim 15, wherein the integrated circuit further comprises an interpolator circuit coupled to the delay line, the method further comprising:

the delay line shifting the phase of a strobe signal input thereto to generate a strobe signal with a phase offset; and in loopback testing, using the-interpolator circuit to vary the phase offset of the strobe signal.

17. The method of claim 16, and further comprising:

controlling the interpolator circuit in response to a plurality of control codes, each of which corresponds to a different phase offset.

18. The method of claim 17, wherein the interpolator circuit comprises a logic circuit responsive to the plurality of control codes, and further comprising:

the logic circuit mixing the strobe signal with a delayed strobe signal to generate the strobe signal with a phase offset.

19. The method of claim 18, wherein the logic circuit comprises a plurality of transmission gates each of which has a control gate, and further comprising:

each control gate receiving a portion of the plurality of control codes.

20. In an integrated circuit comprising at least one input/output circuit to receive a data signal and a strobe signal, and further comprising at least one delay line coupled to the at least one input/output circuit to shift a phase of the strobe signal and to generate a strobe signal with a phase offset, the method comprising:

enabling an interpolator circuit coupled to the delay line; and using the interpolator circuit to vary the phase offset of the strobe signal.

21. The method of claim 20, and further comprising:

controlling the interpolator circuit in response to a plurality of control codes, each of which corresponds to a different phase offset.

22. The method of claim 21, wherein the interpolator circuit comprises a logic circuit responsive to the plurality of control codes, and further comprising:

the logic circuit mixing the strobe signal with a delayed strobe signal to generate the strobe signal with a phase offset.

23. The method of claim 22, wherein the logic circuit comprises a plurality of transmission gates each having a control gate, and further comprising:

each control gate receiving a portion of the plurality of control codes.

24. The method of claim 20, further comprising:

varying the phase offset to align the strobe signal with respect to a data cell of the data signal.

25. The method of claim 20, wherein the integrated circuit further comprises a phase detector, and wherein the at least one delay line generates a phase offset of known value at a tap of the delay line, the method further comprising:

the phase detector comparing the phase offset of known value with the phase offset at an output of the interpolator circuit.

* * * * *

UNITED STATES PATENT AND TRADEMARK OFFICE
CERTIFICATE OF CORRECTION

PATENT NO.   : 6,348,826 B1
DATED        : February 19, 2002
INVENTOR(S)  : Mooney et al.

It is certified that error appears in the above-identified patent and that said Letters Patent is hereby corrected as shown below:

Column 12,
Line 58, delete "configures" and insert -- configured --, therefor.

Column 5,
Line 61, insert:
   -- As mentioned below regarding the description of the I/O circuit shown in FIG. 7, a digital variable-delay circuit such as that shown in FIG. 2 can be used in an I/O circuit to delay a strobe signal to position the edges of the strobe signal with respect to the data cells of a data signal. At the top of FIG. 4, a representative data signal includes various data cells of which data cells A-D are depicted. Data cells A. C, and D have logical "1" values, and data cell B has a logical "0" value. In this example, the rising edge of strobe signal 71 corresponds to the rising edge of data cell A, and the falling edge of strobe 71 corresponds to the falling edge of data cell A. As mentioned above, traces 73-81 represent the strobe signal delayed by an amount ranging from 30 degrees to 270 degrees. Reference may be had to the above-identified U.S. Pat. No. 5,905,391 for further description of data signals, data cells, strobe signals, and delayed strobe signals. --

Signed and Sealed this

Twentieth Day of August, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.   : 6,348,826 B1
DATED        : February 19, 2002
INVENTOR(S)  : Mooney et al.

It is certified that error appears in the above-identified patent and that said Letters Patent is hereby corrected as shown below:

Column 6,
Line 55 through column 7, line 8, please delete

"

| S<2:0> | E<3:0> | L<3:0> |
|---|---|---|
| 000 | 1110 | 0000 |
| 001 | 1101 | 1000 |
| 010 | 1100 | 1001 |
| 011 | 1011 | 1010 |
| S<2:0><br>$S_2,S_1,S_0$ | E<3:0><br>$L_3,E_2,E_1,E_0$ | L<3:0><br>$L_3,L_2,L_1,L_0$ |
| 000 | 1101 | 0000 |
| 001 | 1011 | 0001 |
| 010 | 1001 | 0011 |
| 011 | 0111 | 0101 |
| 100 | 0101 | 0111 |
| 101 | 0011 | 1001 |
| 110 | 0001 | 1011 |
| 111 | 0000 | 1101 |

"

UNITED STATES PATENT AND TRADEMARK OFFICE
CERTIFICATE OF CORRECTION

PATENT NO. : 6,348,826 B1
DATED : February 19, 2002
INVENTOR(S) : Mooney et al.

It is certified that error appears in the above-identified patent and that said Letters Patent is hereby corrected as shown below:

and insert --

| S<2:0><br>$S_2,S_1,S_0$ | E<3:0><br>$L_3,E_2,E_1,E_0$ | L<3:0><br>$L_3,L_2,L_1,L_0$ |
|:---:|:---:|:---:|
| 000 | 1101 | 0000 |
| 001 | 1011 | 0001 |
| 010 | 1001 | 0011 |
| 011 | 0111 | 0101 |
| 100 | 0101 | 0111 |
| 101 | 0011 | 1001 |
| 110 | 0001 | 1011 |
| 111 | 0000 | 1101 |

Table 1: Decoder truth table for M=8 voltage-mixing interpolator

Decoder circuit inputs S0, S1, S2 represent various scan control bit patterns that can be input by the user via software switches. The 8 combinations of scan control bits S<2:0> are also referred to as digital control codes. The circuit implementation of decoder circuit 160 can be readily achieved by one of ordinary skill in the art.--, therefor.

Signed and Sealed this

Twentieth Day of August, 2002

*Attest:*

*Attesting Officer*

JAMES E. ROGAN
*Director of the United States Patent and Trademark Office*